United States Patent [19]

Allen

[11] Patent Number: 4,868,094

[45] Date of Patent: Sep. 19, 1989

[54] PROCESS OF PRODUCING POLY(ACETYLENE) FILMS HAVING LOCALIZED ZONES OF A LOW CONDUCTIVITY MATERIAL

[76] Inventor: Philip C. Allen, 3 Denison Road, Feltham, Middlesex, England, TW13 4PY

[21] Appl. No.: 232,771

[22] Filed: Aug. 16, 1988

Related U.S. Application Data

[62] Division of Ser. No. 3,481, Jan. 15, 1987, Pat. No. 4,798,789.

[30] Foreign Application Priority Data

Feb. 8, 1986 [GB] United Kingdom ................. 8603162
Feb. 13, 1986 [GB] United Kingdom ................. 8603557

[51] Int. Cl.$^4$ ............................................. G03C 5/00
[52] U.S. Cl. ................................. 430/322; 430/269; 430/270; 430/325; 430/326; 430/330
[58] Field of Search .................. 430/9, 13, 269, 270, 430/281, 322, 325, 326, 330; 522/182

[56] References Cited

U.S. PATENT DOCUMENTS 3,954,816  3/1979  Bloom et al. .
4,439,514  4/1984  Garito et al. .
4,649,100  10/1987  Leyrer .

FOREIGN PATENT DOCUMENTS 1105542  7/1978  Japan .

OTHER PUBLICATIONS

Tieke et al, "The Quantum Yield of the Topochemical Photopolymerization of Diacetylenes in Multilayers", Makromol. Chem.
Day et al, "Polymerization of Diacetylene Carbonic Acid Monolayers at the Gas-Water Interface", J. Polymer Science.
Lieser et al, "Polymerization of Diacetylenes in Multilayers", J. Polymer Science.
Kaner et al, "Plastics that Conduct Electricity", Scientific American.

Primary Examiner—Jack P. Brammer
Attorney, Agent, or Firm—Brooks Haidt Haffner & Delahunty

[57] ABSTRACT

This invention relates to poly(acetylene) films having localized zones of a material other than poly(acetylene) with modified optical and electrical properties. The films are formed by selectively irradiating discrete areas of a film of a precursor polymer followed by heating of the irradiated precursor polymer to transform the non-irradiated areas into poly(acetylene). The resultant product has localized zones of modified electrical and optical properties which are useful in the semiconductor industries and in optical devices.

6 Claims, No Drawings

PROCESS OF PRODUCING POLY(ACETYLENE) FILMS HAVING LOCALIZED ZONES OF A LOW CONDUCTIVITY MATERIAL

This application is a division of co-pending application Ser. No. 07/003,481, filed Jan. 15, 1987.

The present invention relates to the production of poly(acetylene) films having localised zones with modified optical and electrical properties and a process for the production thereof.

Polyacetylene is known to have highly desirable electrical conducting properties and a number of techniques for preparing poly(acetylene) are known. Our EP-A-No. 0080329 describes a method of producing coherent poly(acetylene) films by casting a film of a precursor polymer and thermally decomposing the film so formed between 20° and 200° C. FIG. 1 of the drawings accompanying that specification illustrates this reaction for the formation of poly(acetylene).

It is a requirement of semiconductor circuits that areas of different conductivity can be formed adjacent to one another. Similarly, to exploit the optical properties of a film efficiently it is desirable to have areas of different optical properties adjacent to one another in the film. The usual process for forming such regions involves the use of photoresists and etching or doping techniques. These are complex multi-step processes.

Photoresists are widely used in the semiconductor industry. Use of phototresists allows specific regions of a semiconductor layer to be physically protected whilst other regions are exposed to some process. We can consider a layer of photoresist on the flat surface of a semiconductor layer. The action of light on the photoresist layer is termed "exposure" of the layer. Exposure of certain areas of the photoresist layer will allow the regions of that layer to be selectively dissolved away using certain chemicals (developers). The regions from which the photoresists has been removed (by developing) are often referred to as "windows". These windows are usually of complex shape and their dimensions may be accurate to about 0.5 micrometers. The semiconductor exposed when these windows are created can then be selectively treated in order to modify their optical and electrical properties using a variety of processes. After such treatments have been carried out the remaining photoresist material is removed from the semiconductor surface. This is usually done by washing in a suitable solvent (not a developer).

The term masking is usually applied to the process by which exposure (to light) of the photo-resist layer is confined to specific regions using a mask.

The mask for selective exposure is generally a quartz plate with areas on one surface thereof specifically metallised to prevent the transmission of light. The non-metallised areas correspond to the regions in the photoresist layer to be exposed. The mask is placed on the surface of the photoresist during exposure. After exposure the mask is simply lifted off the photoresist layer.

If it is intended that poly(acetylene) films are used as conductive or semiconductive materials in complex electronic devices or similar applications it is necessary to establish zones of low conductivity in the film. Moreover, if it is intended to utilize the optical properties of poly(acetylene) films it is desirable to establish in the film zones with modified optical and electrical properties.

Thus the present invention is a poly(acetylene) film containing localised or discrete zones with modified optical and electrical properties and a process for preparing the same. The present process eliminates the conventional stages of coating with photoresist, etching and photoresist stripping used for semiconductors and provides a novel technique for manufacturing flexible circuit boards and multilevel matrix boards with interconnects.

Accordingly, the present invention is a coherent, (continuous) poly(acetylene) film having localised zones of a material other than poly(acetylene) with modified optical and electrical properties, said zones being integral with the film.

By "modified" is meant herein that specific discrete areas within the coherent poly(acetylene) are of a material other than poly(acetylene) having different optical and electrical properties from that of conventional pristine poly(acetylene) film. The modified zones have a lower electrical conductivity than poly(acetylene) and a wider optical band gap and are hence transparent in the visible region with a lower refractive index. Preferably, the modified zones will have conductivities not greater than $3 \times 10^{-8}$, most preferably about $4 \times 10^{-9}$ $ohm^{-1}cm^{-1}$. Similarly, the optical band gap of the pristine poly(acetylene) is from 1.4–1.7 eV, whereas that of the irradiated and transformed zones is suitably greater than 2 eV, preferably above 3 eV. Again, the refractive index of the pristine poly(acetylene) is approximately 3–3.5, whereas that of the irradiated and transformed zones is about 1.5–2.

According to a further embodiment the present invention is a process for producing coherent poly(acetylene) films having localised zones of a material other than poly(acetylene) with modified optical and electrical properties, said process comprising selectively irradiating in the presence of oxygen or a gas containing oxygen discrete areas of a film of the precursor (co)polymer comprising structural units of formula (I) with a light source having a wave-length in the ultraviolet and visible regions and then heating under vacuum or in an atmosphere inert under the reaction conditions the selectively irradiated (co)polymer film to a temperature from 20° to 200° C. under reduced pressure so that upon heating, the selectively irradiated areas of the film form the zones with modified optical and electrical properties, whereas the non-irradiated areas transform into poly(acetylene).

The term '(co)polymer' as used herein is meant to embrace both polymers and copolymers of the precursor monomer(s).

In order to accomplish the invention, discrete areas of the film of the precursor (co)polymer are selectively irradiated with light, e.g. by protecting other areas of the film using a contact mask prior to irradiation. Thereafter, upon irradiation of the unmasked, exposed areas with light followed by removal of the protective contact mask and then heating, the selectively irradiated areas do not transform into poly(acetylene) but form the zones with modified optical and electrical properties, whereas the masked areas of the precursor (co)polymer film not irradiated with light are transformed into poly(acetylene). In this manner a coherent poly(acetylene) film is formed which has integral therewith specific discrete areas of a material other than poly(acetylene) with modified optical and electrical properties resulting in conductive or semiconductive circuits suitable for flexible circuit boards.

The precursor (co)polymer film used herein comprises structural units of the formula (I):

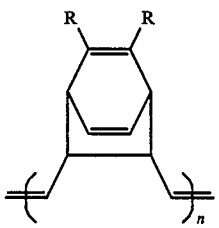

where R is a substituent which is a hydrogen atom or a group selected from an alkyl, a halo alkyl, an ester and combinations thereof.

The preferred substituents R are selected from a hydrogen atom, an alkyl or a halo alkyl group having 1 to 4 carbon atoms, and esters of carboxylic acids having 1 to 4 carbon atoms. Most preferred substituents include H, $CF_3$ and $COOCH_3$.

The precursor (co)polymers used can be prepared by conventional techniques known to those skilled in the art. Typically, organic solutions of the (co)monomers are mixed to the desired ratio followed by polymerisation in the presence of a suitable metathesis catalyst. The solution is typically polymerised at temperatures from about $-50°$ C. to about 70° C., preferably 0° to 10° C., in an atmosphere substantially inert to the (co)monomer reactants and to the (co)polymers being prepared under the reaction conditions employed.

Examples of suitable metathesis catalysts include molybdenum pentachloride/tetra-alkyl tin and tungsten hexachloride/tetra-alkyl tin.

The precursor (co)polymer may be shaped into films and then easily converted into poly(acetylene) films by heating. It is preferable that the precursor (co)polymers are shaped into films by spin coating. In the spin coating, the precursor (co)polymer is initially dissolved in a suitable solvent to a typical concentration of 100 to 150 grams per litre. The solvent is preferably an organic solvent such as acetone, chloroform, ethyl acetate, toluene, xylene, methyl ethyl ketone and the like. Methyl ethyl ketone is most preferred. Thereafter, the surface of a substrate is flooded with a solution of the precursor (co)polymer and then spun at speeds between 1,500 and 10,000 rpm for a period of 5 to 60 seconds. As the solution is spun into a thin film, the solvent is lost by evaporation leaving a uniform thin layer of precursor (co)-polymer. A suitable substrate for spin coating is typically a flat disc of a hard material (e.g. glass) with a polished surface. By this method films of the precursor (co)polymer having a thickness of up to 5 micrometers can be produced.

In order to produce poly(acetylene) films having discrete localised zones with modified optical and electrical properties, discrete areas of the film of the precursor (co)polymer formed by e.g. spin coating are selectively irradiated with light having a wave-length in the ultraviolet and visible regions suitably below 450 nm. The thickness of the precursor (co)polymer to be irradiated is suitably below 3 micrometers. It is preferable to physically mask the areas which are not to be exposed to light. Such masking techniques are well known in the semiconductor industry.

The light source can be any source which is capable of generating light with wave-lengths in the above regions, although xenon lamps have been found particularly suitable.

In order to ensure proper transformation of the irradiated precursor (co)polymer films into poly(acetylene) films having discrete zones with modified optical and electrical properties, the selective irradiation of the precursor (co)polymer with light should occur in the presence of oxygen or a gas containing oxygen. The duration for which the irradiation is carried to will vary according to the intensity of the irradiation used, the thickness of the polymer film and upon the degree of modification desired. It will be typically from 5 to 200 minutes, preferably from 15 to 150 minutes.

The precursor (co)polymer film selectively irradiated with light and after removal of the masking material, if any used to protect the other areas, is transformed upon heating to elevated temperatures into a poly(acetylene) film having integral therewith discrete areas with modified optical and electrical properties. The temperature and duration of the heat treatment will depend upon the rate of transformation desired. The irradiated precursor (co)polymer film is suitably heated at temperatures below 130° C., preferably from 70° to 120° C. under vacuum or in an inert atmosphere. The heating procedure may be carried out for a period from about 30 minutes to about 100 hours, preferably from 90 minutes to 20 hours, to transform the non-irradiated areas of the precursor (co)-polymer into poly(acetylene). Since the rate of transformation depends on temperature, lower temperatures require longer durations of heating. The thickness of the transformed product is suitably below 1.5 micrometers.

The electrical properties of the poly(acetylene) produced according to the present invention may be altered as desired by addition of suitable dopants known in the art. The dopants can be added by conventional techniques such as by chemical or electrochemical doping. Both p and n type dopants can be employed.

Upon doping, the conductivity of the poly(acetylene) can be substantially increased. For instance, by using iodine as the dopant, the conductivity of the coherent film may be improved to a value of between 1 and 20 $ohm^{-1}cm^{-1}$. Surprisingly however, doping does not significantly affect the conductivity of the low conductivity material within the film. Thus, the entire film can be doped to increase the poly(acetylene) conductivity without affecting the zones of the low conductivity material making the present invention highly suitable for commercialisation.

It has been found that the modified zones of low conductivity in the final product have the following properties:

(a) The zone is less opaque to visible light than poly(acetylene). Zones of the precursor polymers exposed to high doses of radiation transform to a material which is transparent and is at least 15 times less conductive than pristine polyacetylene.

(b) A pristine precursor polymer layer loses from 66–75% of its thickness when transformed to poly(acetylene). Irradiated zones of precursor polymer contract to a lesser extent when transformed without loss of film continuity. Distinct zones of the lower conductivity product are therefore thicker than adjacent zones of poly(acetylene) in the products of this invention.

(c) Pristine poly(acetylenes) show strong absorptions only at ca 1020 and ca 3000 $cm^{-1}$. The modified zones (unlike polyacetylene) show additional absorptions at around 1000 to 1800 $cm^{-1}$ which are similar to the original precursor polymer prior to irradiation. The absorptions of the modified zones are very weak or are nonexistent at ca 1020 and 3000 cm$^{-1}$.

The principle of the present invention is further illustrated by the following Example in which the preparation and properties of a modified material derived by irradiation of a precursor of poly(acetylene) are described. However, this invention includes variations, modifications and equivalent embodiments which fall within the spirit of this invention.

EXAMPLE 1

Five samples of thin layers of precursor polymer made by the polymerisation of dimethyltricyclo [4.2.2.0$^{2,5}$] deca-3,7,9-triene-7,8-dicarboxylate monomer formate were spun onto substrates using a solution of the precursor polymer.

solution:
5 grams of precursor polymer+40 mls methyl ethyl ketone
substrate size:
26×26×1.1 mm
spinning speed and duration:
5,00 rpm for 30 seconds.

Five samples, each having a layer of the precursor polymer film having a thickness of 0.3 microns were thus formed on glass substrates by spin coating. The samples were stored (3 days) in air, in the dark and at −30° C. before proceeding.

The five samples were then placed two inches from a xenon arc lamp (obtained from Oriel Scientific Limited, UK) which was run at 6A, 12V for irradiation periods of 0 (control), 5, 15, 45 and 136 minutes respectively. The five samples were then heated in a vacuum oven (pressure less than 10$^{-1}$ Torr) at 100° C. for about 1.5 hours.

A pattern of gold electrodes was vacuum deposited on the surface of each polymer film using a shadow mask as follows: The shadow mask was a flat, thin sheet of metal in which windows of predetermined shapes were cut. The mask was placed on a polymer film and the masked film was placed in a vacuum chamber. The chamber was evacuated and gold was vacuum deposited thereon. The gold passing through the windows in the mask onto the polymer film formed an electrode pattern. The films were allowed minimal contact with air. Resistance measurements were then made using the gold electrodes in the dark under an argon atmosphere. The results are shown in Table I which indicate that they represent a range of high resistivity (i.e. low conductivity) materials.

The five films were then placed in an oxygen evacuated chamber for about 1.5 hours with iodine crystals at room temperature to partially dope the poly(acetylene) in the films. Another set of resistance measurements was then taken with the partially doped films. These results shown in Table I indicate that high resistivity materials are less responsive to doping. Pristine poly(acetylene) can be doped to improve its conductivity by factors of about 10$^8$. In the Examples given the layer of poly(acetylene) is necessarily exposed to air causing some degree of degradation and the doping was also only partial. Therefore, doping has improved the conductivity of the polymer in the control layer by a factor of only about 10$^5$.

TABLE I

| | Resistance of Heat Treated Layers | | |
|---|---|---|---|
| Sample | Exposure to Xenon lamp prior to heating (min) | Resistance After heating (ohms) Before Doping | After Doping |
| Control (polyacetylene) | 0 | $1.0 \times 10^{11}$ | $1.0 \times 10^{6}$ |
| 1 | 5 | $1.1 \times 10^{11}$ | $2.2 \times 10^{6}$ |
| 2 | 15 | $2.0 \times 10^{11}$ | $2.4 \times 10^{10}$ |
| 3 | 45 | $8.7 \times 10^{11}$ | $3.3 \times 10^{11}$ |
| 4 | 135 | $1.5 \times 10^{12}$ | $5.2 \times 10^{11}$ |

EXAMPLE 2

Two samples of thin films of precursor polymer, made by the polymerisation as described in Example 1, were spun onto substrates using a solution of precursor polymer.

Solution: 1 gm precursor polymer to 10 ml methyl ethyl ketone
Substrate: Quartz disc, 47 mm diameter, 1.5 mm thick
Film Spinning: 1500 rpm for 60s.

The precursor film thickness was approximately 2.8 micrometers.

One sample was then exposed to the output of a xenon arc lamp, in air, for a period sufficient to ensure complete modification of the material.

Both samples were then heated in a vacuum oven (pressure less than 0.1 Torr) at 80 c for 17 hours.

After transformation the film thicknesses were 0.93 micrometers and 1.5 micrometers for the unirradiated and irradiated films respectively. The refractive index of the films was estimated from interference fringes in the optical transmission spectra.

The refractive index values for the irradiated and unirradiated films, in the range 1-2 micrometers, are shown below:

Unirradiated (polyacetylene) 3.5–3
Irradiated 2.0–1.6

Thus exposure of the precursor polymer to UV irradiation prior to transformation has resulted in a considerable modification of the refractive index in the wavelength region 1-2 micrometers.

I claim:

1. A process for producing a coherent poly(acetylene) film having integral therewith localized zones of a material other than poly(acetylene) which has modified optical and electrical properties from that of conventional pristine poly(acetylene) film, said process comprising:
selectively irradiating discrete areas of a film of a (co)polymer poly(acetylene) precursor of formula (I):

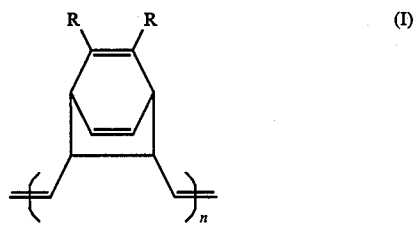

where R is a substituent which is hydrogen or a group selected from an alkyl, a halo alkyl, an ester and combinations thereof: and, then heating so that upon heating the selectively irradiated areas form the localized zones and the non-irradiated areas transform into poly(acetylene).

2. A process according to claim 1 comprising:

selectively irradiating in the presence of oxygen or a gas containing oxygen discrete areas of a film of a (co)polymer of poly(acetylene) precursor formula (I) with light having a wavelength in the ultraviolet and/or visible region; and then heating under a vacuum or in an atmosphere inert under the reaction conditions the selectively irradiated film to a temperature from 20° to 200° C. under reduced pressure so that upon heating the selectively irradiated area form the localized zones and the non-irradiated areas transform into poly(acetylene).

3. A process according to claim 2 wherein discrete areas of the film of the precursor (co)polymer are selectively irradiated with light by protecting other areas of the film using a contact mask prior to irradiation.

4. A process according to any one of claims 2 or 3 wherein the substituent R in the precursor copolymer of formula (I) is selected from a hydrogen atom, an alkyl or a haloalkyl group having 1 to 4 carbon atoms, and an ester of a carboxylic acid having 1 to 4 carbon atoms.

5. A process according to any one of claims 2 or 3 wherein a film of the precursor (co)polymer is formed by dissolving the (co)polymer in a solvent and then shaping into films by spin coating.

6. A process according to claim 5 wherein the film of the precursor (co)polymer has a thickness of up to 5 micrometers.

* * * * *

UNITED STATES PATENT AND TRADEMARK OFFICE
CERTIFICATE OF CORRECTION

PATENT NO. : 4,868,094
DATED : September 19, 1989
INVENTOR(S) : Philip C. Allen

It is certified that error appears in the above-identified patent and that said Letters Patent is hereby corrected as shown below:

Col. 1, line 30, correct spelling of word "photoresists"

Col. 1., l. 54, should read "The mask used for"

Col. 4, l. 9, should read "is carried out will"

Col. 5, l. 10, should read "of this disclosure".

Col. 5, l. 26, should read "5,000 rpm"

Col. 5, l. 35, should read "and 135 minutes"

Col. 7, l. 3, after "thereof" change the colon to a semi-colon.

Claim 2, line 11, change "area" to --areas--.

Signed and Sealed this

Eleventh Day of December, 1990

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO.  : 4,868,094

DATED       : September 19, 1989

INVENTOR(S) : PHILIP CHARLES ALLEN

It is certified that error appears in the above-identified patent and that said Letters Patent is hereby corrected as shown below:

On the cover page, between line items [75] and [21], should be inserted:

--[73] Assignee:   The University of Nottingham--

In line item [62] "4,798,789" should read --4,798,782--.

Signed and Sealed this

Second Day of April, 1991

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,868,094

DATED : September 19, 1989

INVENTOR(S) : Philip Charles Allen

It is certified that error appears in the above-identified patent and that said Letters Patent is hereby corrected as shown below:

On the title page, between line items [75] and [21], should be inserted:

--[73] Assignee: The British Petroleum Company p.l.c., London, England--.

In line item [62] "4,798,789" should read --4,798,782--.

Signed and Sealed this

Fourteenth Day of January, 1992

Attest:

HARRY F. MANBECK, JR.

*Attesting Officer*  *Commissioner of Patents and Trademarks*